(12) United States Patent
Duarte de Martin et al.

(10) Patent No.: US 8,017,474 B2
(45) Date of Patent: Sep. 13, 2011

(54) PROCESS OF FORMING AN ELECTRONIC DEVICE INCLUDING A RESISTOR-CAPACITOR FILTER

(75) Inventors: Fabio Duarte de Martin, Sao Paulo (BR); Fabio de Lacerda, Sao Paulo (BR); Alfredo Olmos, Sao Paulo (BR)

(73) Assignee: Freescale Semiconductor, Inc., Austin, TX (US)

( * ) Notice: Subject to any disclaimer, the term of this patent is extended or adjusted under 35 U.S.C. 154(b) by 366 days.

(21) Appl. No.: 12/133,992

(22) Filed: Jun. 5, 2008

(65) Prior Publication Data

US 2009/0302364 A1 Dec. 10, 2009

(51) Int. Cl.
*H01L 29/94* (2006.01)
(52) U.S. Cl. ........ 438/250; 257/296; 257/379; 257/533; 257/E21.004; 438/238; 438/381
(58) Field of Classification Search ................ 257/296, 257/E27.016, E21.008, E21.009, E21.017; 438/250, 393, 251, 252, 395
See application file for complete search history.

(56) References Cited

U.S. PATENT DOCUMENTS

| 4,700,212 | A | 10/1987 | Okazawa |
| 5,629,655 | A | 5/1997 | Dent |
| 5,714,411 | A * | 2/1998 | Trahan et al. ............... 438/250 |
| 6,090,656 | A * | 7/2000 | Randazzo .................. 438/239 |
| 6,246,084 | B1 * | 6/2001 | Kim ............................ 257/296 |
| 6,586,817 | B1 | 7/2003 | Burr |
| 6,636,108 | B2 | 10/2003 | Nishikawa |
| 6,790,724 | B1 * | 9/2004 | Chin et al. ................. 438/252 |
| 6,965,151 | B2 | 11/2005 | Burr |
| 7,037,772 | B2 * | 5/2006 | Yeo et al. .................... 438/210 |

* cited by examiner

*Primary Examiner* — Thao X Le
*Assistant Examiner* — Tanika Warrior

(57) ABSTRACT

A process of forming an electronic device can include forming a capacitor dielectric layer over a base region, wherein the base region includes a base semiconductor material, forming a gate dielectric layer over a substrate, forming a capacitor electrode over the capacitor dielectric layer, forming a gate electrode over the gate dielectric layer, and forming an input terminal and an output terminal to the capacitor electrode. The input terminal and the output terminal can be spaced apart from each other and are connected to different components within the electronic device. A filter can include the base region, the capacitor dielectric layer, and the capacitor electrode. A transistor structure can include the gate dielectric layer and the gate electrode. An electronic device can include a low-pass filter and a transistor structure, such as an n-channel transistor or a p-channel transistor.

18 Claims, 13 Drawing Sheets

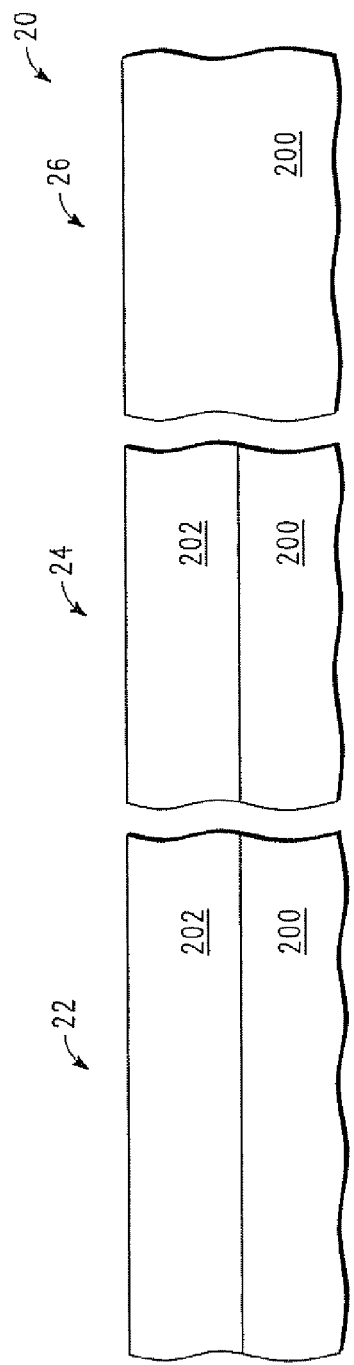
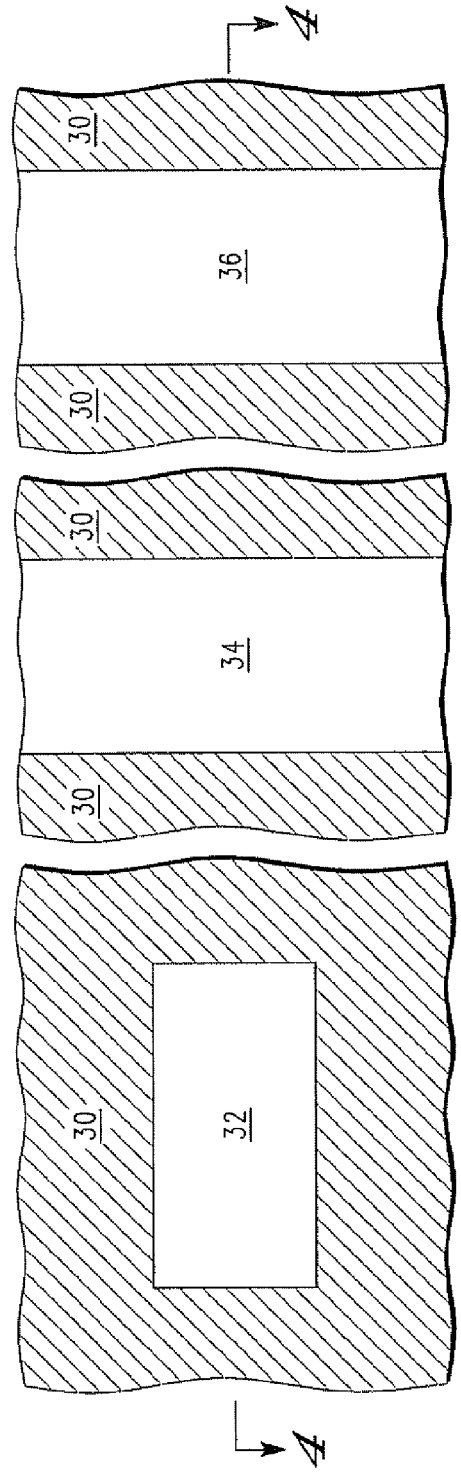
FIG. 2
FIG. 3

PROCESS OF FORMING AN ELECTRONIC DEVICE INCLUDING A RESISTOR-CAPACITOR FILTER

BACKGROUND

1. Field of the Disclosure

The present disclosure relates to electronic devices, and more particularly to electronic devices including resistor-capacitor filter and processes of forming the same.

2. Description of the Related Art

Electronic devices can include low-pass filters that allow low-frequency signals to pass but do not allow high frequency signals to pass. The low-pass filter can be implemented as a resistor-capacitor ("RC") circuit. When fabricating an RC low-pass filter, a capacitor structure can be formed over the substrate. For example, a lower electrode of the capacitor can be formed when forming gate electrodes, and the upper electrode of the capacitor can be formed when polysilicon resistors or other features are also being formed, for example, for load resistors within static-random-access memory ("SRAM") cells. Thus, a double polysilicon process flow is typically used to form SRAM cells having load resistors. Alternatively, in floating gate nonvolatile memory cells, one polysilicon layer can be used to form floating gate electrodes, and another polysilicon layer can be used to form control gate electrodes. Similar to the SRAM cells, the nonvolatile memory cells can have a double polysilicon process flow and may lend itself to formation of an RC low-pass filter. However, many integrated circuits are formed with a single polysilicon process flow, and thus, a load resistor layer (after forming a gate layer) or a control gate layer (after forming a floating gate layer) is unavailable.

BRIEF DESCRIPTION OF THE DRAWINGS

Embodiments are illustrated by way of example and are not limited in the accompanying figures.

FIG. 2 includes an illustration of a cross-sectional view of portions of a workpiece after forming a well region.

FIGS. 3 and 4 include illustrations of a top view and a cross-sectional view, respectively, of the workpiece of FIG. 2 after forming a field isolation region.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include an RC low-pass filter that can include a resistive electrode, a capacitor dielectric layer, and another resistive electrode. In a particular aspect, the RC low-pass filter can be formed using a single polysilicon process, thus, simplifying process integration. In a particular embodiment, a lower resistive electrode can include a portion of a base region, such as a base layer (e.g., a semiconductor substrate) or a well region within the semiconductor substrate, and the upper resistive electrode can be formed from a doped polysilicon layer used to also form gate electrodes. The capacitor dielectric layer can be formed at substantially the same time and have substantially the same composition and thickness as a gate dielectric layer formed over other parts of the electronic device. Therefore, an RC low-pass filter can be formed using a single polysilicon process without having to integrate another polysilicon or other similar layer into the process flow.

Unless otherwise defined, all technical and scientific terms used herein have the same meaning as commonly understood by one of ordinary skill in the art to which this invention belongs. Other features and advantages of the invention will be apparent from the following detailed description, and from the claims. To the extent not described herein, many details regarding specific materials, processing acts, and circuits are conventional and may be found in textbooks and other sources within the semiconductor and microelectronic arts. While many numerical values are provided for thicknesses, depths, concentrations, etc., after reading this specification, skilled artisans appreciate that values outside the limits may be used without departing from the scope of the invention.

Figure 1:
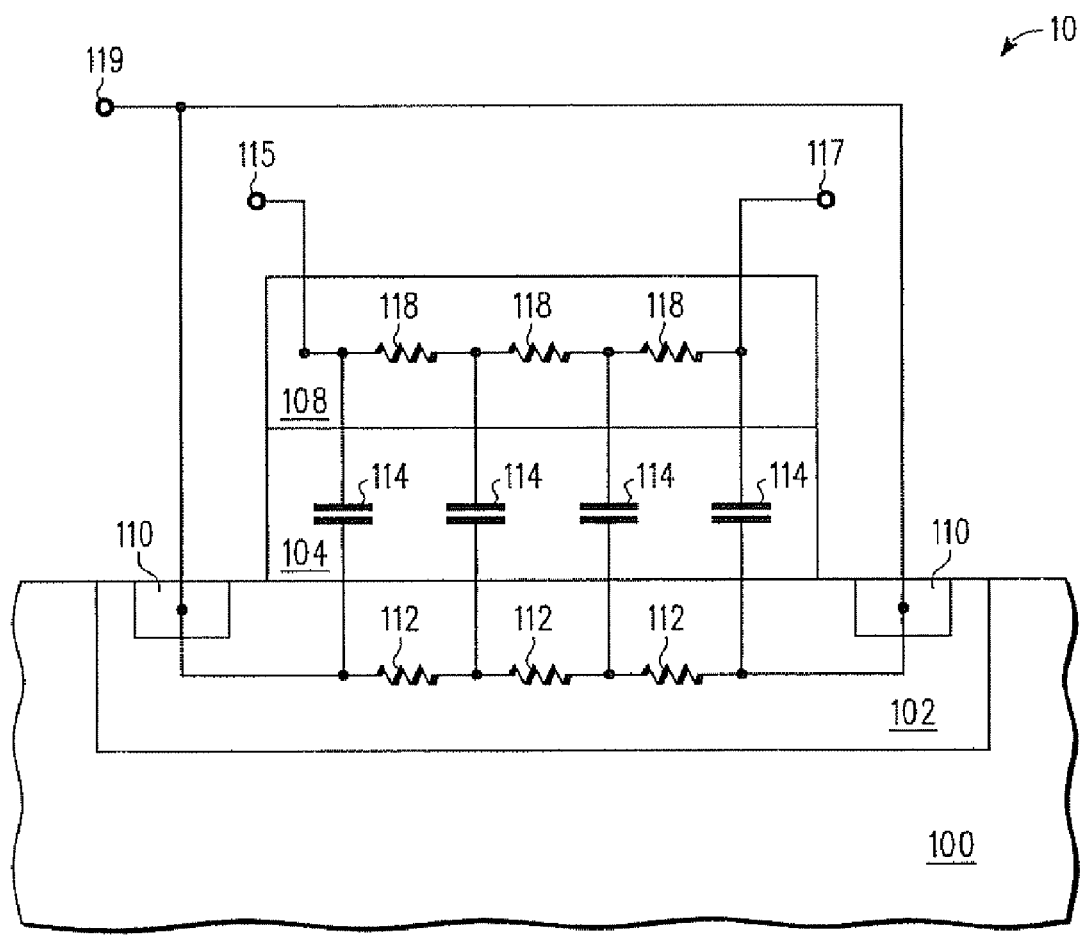
FIG. 1 includes an illustration of a hybrid diagram of an electrical circuit/physical structure for a resistor-capacitor low-pass circuit.

FIG. 1 includes an illustration of hybrid cross-sectional view and electronic circuit diagram to illustrate how physical features correspond to electrical circuit components. An electronic device can include a base layer 100 and a well region 102 within the base layer 100. The well region 102 includes well ties 110 that are coupled to a terminal 119. The terminal 119 may be at a substantially constant voltage during normal operation of the electronic device. The portion of the well region 102 between the well ties can be modeled as a series of resistors 112 that are coupled to the well ties 110. A capacitor dielectric layer 104 and a resistive electrode 108 can be formed and patterned over the well region 102. Similar to the well region 102, the resistive electrode 108 can be modeled as a series of resistors 118. Capacitors 114, which include the capacitor dielectric layer 104, can be modeled as being connected at nodes between the resistors 112 and 118, as illustrated in FIG. 1. A terminal 115 can be coupled near an end of the resistive electrode 108, and a terminal 117 can be coupled near an opposite end of the resistive electrode 108. The combination of the circuit components as illustrated in FIG. 1 form a RC low-pass filter 10. In a particular embodiment, the terminal 115 can be an input terminal for the RC low-pass filter 10, and the terminal 117 can be an output terminal for the RC low-pass filter 10.

The resistance of the well region 102 and the resistive electrode 108, and the capacitance corresponding to the capacitor dielectric layer 104 can be determined by the circuit design. The dopant profile (e.g., concentration and depth) of the well region 102, the length of the well region 102 between and below the terminals 115 and 117, the width of the well region 102, or any combination thereof can be adjusted to achieve the desired resistance for the resistors 112. Similarly, the dopant concentration of the resistive electrode 108, the thickness of the resistive electrode 108, the distance between the terminals 115 and 117, the width of the resistive electrode 108, or any combination thereof can be adjusted to achieve the desired resistance for the resistors 118. The dielectric constant of the capacitor dielectric layer 104, the thickness of the capacitor dielectric layer 104, the length of the capacitor dielectric layer 104 between and below the terminals 115 and 117, the width of the capacitor dielectric layer 104, or any combination thereof can be adjusted to achieve the desired capacitance for the capacitors 114. After reading this specification, skilled artisans will appreciate that one or more degrees of freedom may be available to adjust one or more processing operations to achieve the needed or desired electronic properties.

An RC low-pass filter, similar to the RC low-pass filter 10, can be part of an electronic device that also can include an n-channel transistor, a p-channel transistor, or other components. The electronic device can be formed using a process flow that uses a single gate level (e.g., a single polysilicon process) and may not require additional steps in some embodiments.

FIGS. 2 to 16 include an exemplary, non-limiting process of forming an electronic device that includes an RC low-pass filter, an n-channel transistor, and a p-channel transistor. After reading this specification, skilled artisans will appreciate that many modifications and other embodiments can be used.

FIG. 2 includes a cross-sectional view of a portion of a workpiece 20 that includes a region 22, a region 24, and a region 26. An RC low-pass filter will be formed within the region 22, a p-channel transistor structure will be formed within the region 24, and an n-channel transistor structure will be formed within the region 26. The regions 22, 24, and 26 can be part of the same or different integrated circuits within the workpiece 20.

The workpiece includes a substrate 200 and a well region 202 formed within the substrate 200. The substrate 200 can include a monocrystalline semiconductor wafer, a semiconductor-on-insulator wafer, a flat panel display (e.g., a silicon layer over a glass plate), or other substrate conventionally used to form electronic devices. The substrate 200 can be n-type doped or p-type doped. In an embodiment, the substrate 200 has a dopant concentration no greater than approximately 1E17 atoms/cm$^3$ or no greater than approximately 1E16 atoms/cm$^3$, and in another embodiment, substrate 200 has a dopant concentration of at least approximately 1E13 atoms/cm$^3$ or at least approximately 1E14 atoms/cm$^3$. In a particular embodiment, the substrate 200 has a dopant concentration in a range of approximately 1E14 to approximately 1E16 atoms/cm$^3$. The portion of the substrate 200 from which electronic components are formed may be referred to as a base layer for the purposes of this specification.

The well region 202 can be formed by selectively doping the substrate 200. As illustrated in the embodiment of FIG. 2, the well region 202 lies within the region 22 and the region 24, but the well region 202 does not lie within region 26. The well region 202 can have a dopant type opposite that of the substrate 200. For example, the substrate 200 can have a p-type dopant, and the well region 202 can have an n-type dopant.

In an embodiment, the well region 202 has a depth no greater than approximately 5 microns or no greater than approximately 2 microns, and in another embodiment, the well region 202 has a depth of at least approximately 0.5 micron or at least approximately 0.3 micron. In a particular embodiment, the well region 202 has a depth in a range of approximately 0.5 to approximately 1.5 microns. The dopant concentration of the well region 202 can be higher than the dopant concentration of the substrate 200. In an embodiment, the well region 202 has a dopant concentration no greater than approximately 1E19 atoms/cm$^3$ or no greater than approximately 1E18 atoms/cm$^3$, and in another embodiment, the well region 202 has a dopant concentration of at least approximately 1E16 atoms/cm$^3$ or at least approximately 1E17 atoms/cm$^3$. In a particular embodiment, the well region 202 has a dopant concentration in a range of approximately 1E17 atoms/cm$^3$ to approximately 1E18 atoms/cm$^3$. The well region 202 can be formed within the substrate 200 using a conventional or proprietary process.

Although not illustrated, a different well region can be formed within the region 26. That different well region can be of the same conductivity type as the substrate 200. The different well region can have a dopant concentration higher than the substrate 200. Any of the depths, dopant concentrations, or any combination thereof as described with respect to the well region 202 can be used for the different well region. As between the different well region and the well region 202, they may have the same depth or different depths, and the same concentration or different concentrations. In still another embodiment (not illustrated), the dopant types of the substrate 200 and well region 202 can be reversed. In this particular embodiment, the substrate 200 is n-type doped, and the well region 202 is p-type doped. As used herein, a base region can be part of a base layer or well region that is used as a resistive electrode within an RC circuit.

Figure 4:
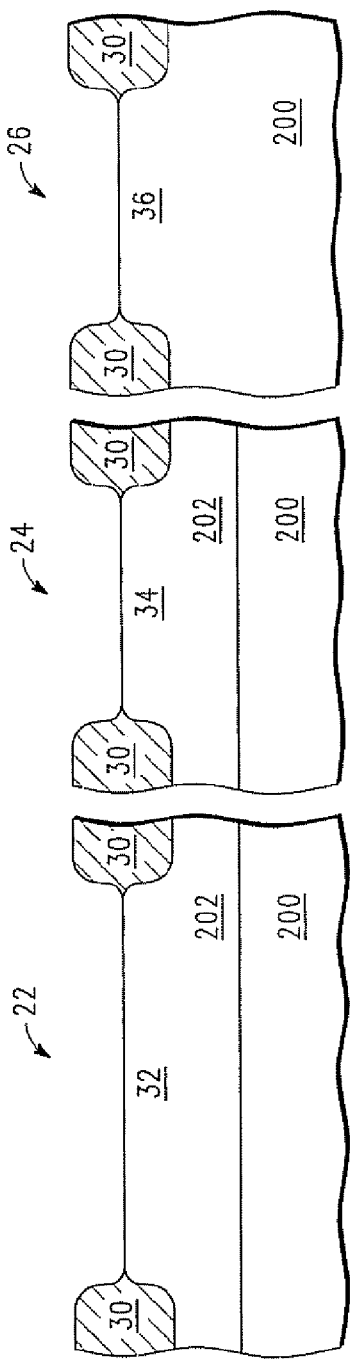

FIGS. 3 and 4 include illustrations of a top view and a cross-sectional view, respectively, after forming a field isolation region 30. Portions of the substrate 200 and well region 202 lying between the field isolation region 30 (where the field isolation region 30 is not formed) define an active region 32 within region 22, an active region 34 within the region 24, and an active region 36 within the region 26. The active region 32 will be used as a resistive electrode for a subsequently formed capacitor, the active region 34 will be part of a p-channel transistor structure, and the active region 36 will be part of an n-channel transistor structure. The field isolation region 30 can be formed using a conventional or proprietary process.

Figure 5:
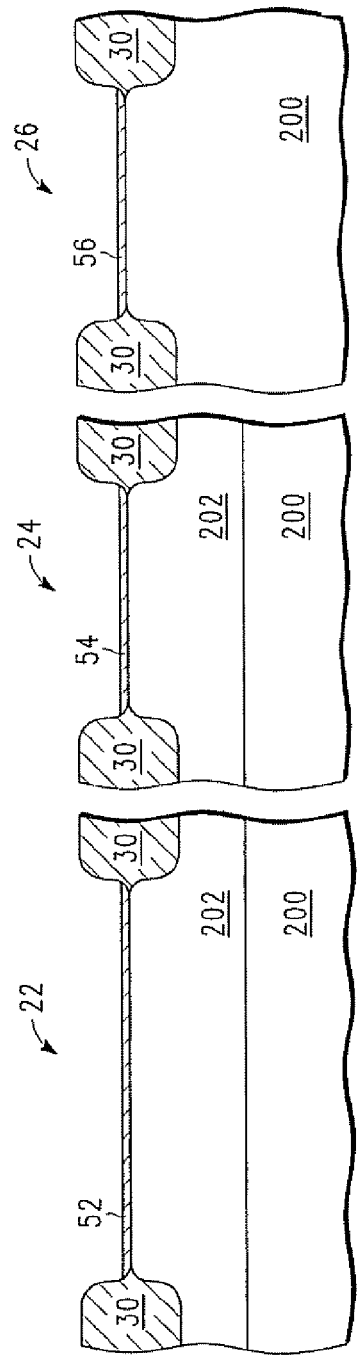
FIG. 5 includes an illustration of a cross-sectional view of the workpiece of FIGS. 3 and 4 after forming dielectric layers.

FIG. 5 includes an illustration of a cross-sectional view after forming a capacitor dielectric layer 52, a gate dielectric layer 54, and a gate dielectric layer 56. Each of the layers 52, 54, and 56 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. In an embodiment, each of the layers 52, 54, and 56 can have a thickness in no greater than approximately 50 nm or no greater than 30 nm, and in another embodiment, each of the layers 52, 54, and 56 can have a thickness of at least approximately 3 nm or at least approximately 5 nm. In a particular embodiment, each of the layers 52, 54, and 56 can have a thickness in a range of approximately 10 nm to approximately 20 nm.

As between the capacitor dielectric layer 52, the gate dielectric layer 54, and the gate dielectric layer 56, those layers may have substantially the same composition or different compositions, and substantially the same thickness or different thicknesses. The composition, thickness, or both of the capacitor dielectric layer 52 can be adjusted to achieve a desired capacitance. In a particular embodiment, the layers have substantially the same composition and thickness. The layers can be thermally grown using an oxidizing or nitridizing ambient, or deposited using a conventional or proprietary chemical vapor deposition technique, physical vapor deposition technique, atomic layer deposition technique, or a combination thereof.

Figure 6:
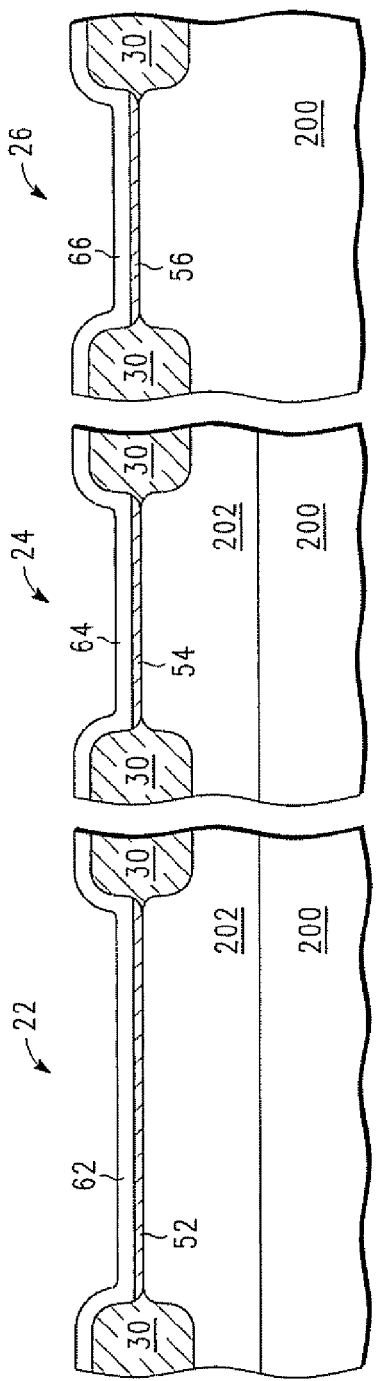
FIG. 6 includes an illustration of a cross-sectional view of the workpiece of FIG. 5 after forming electrode layers.

FIG. 6 includes an illustration of a cross-sectional view after forming a capacitor electrode layer 62, a gate electrode layer 64, and a gate electrode layer 66. Each of the layers 62, 64, and 66 can include one or more films of a semiconductor-containing film, a metal-containing film, or any combination thereof. In an embodiment, each of the layers 62, 64, and 66 can have a thickness in no greater than approximately 500 nm or no greater than 300 nm, and in another embodiment, each of the layers 62, 64, and 66 can have a thickness of at least approximately 30 nm or at least approximately 50 nm. In a particular embodiment, each of the layers 62, 64, and 66 can have a thickness in a range of approximately 100 nm to approximately 300 nm.

In a particular embodiment, the layers 62, 64, 66, or any combination thereof includes polysilicon or amorphous silicon. The polysilicon or amorphous silicon can be doped during or after deposition. In an embodiment, each of the layers 62, 64, and 66 has a dopant concentration of at least 1E17 atoms/$cm^3$, at least 1E18 atoms/$cm^3$, or at least 1E19 atoms/$cm^3$ when polysilicon or amorphous silicon is used.

In another embodiment, the capacitor electrode layer 62 can be formed by depositing an undoped amorphous silicon or polysilicon layer, and annealing the layer to affect the formation or growth of polycrystalline grains. In still another embodiment, the capacitor electrode layer 62 can be formed as an undoped amorphous silicon or polysilicon layer and become doped when subsequently performing a doping operation for a thin-film resistor, lightly doped drain or extension regions, completing formation of source/drain regions, or any combination thereof. Thus, many alternatives can be used to affect the resistance of the capacitor electrode layer 62.

As between the capacitor electrode layer 62, the gate electrode layer 64, and the gate electrode layer 66, those layers may have the same composition or different compositions, and the same thickness or different thicknesses. In a particular embodiment, the layers have substantially the same composition and thickness. The layers can be formed using a conventional or proprietary deposition technique, and if doped, a conventional or proprietary doping technique.

Figure 7:
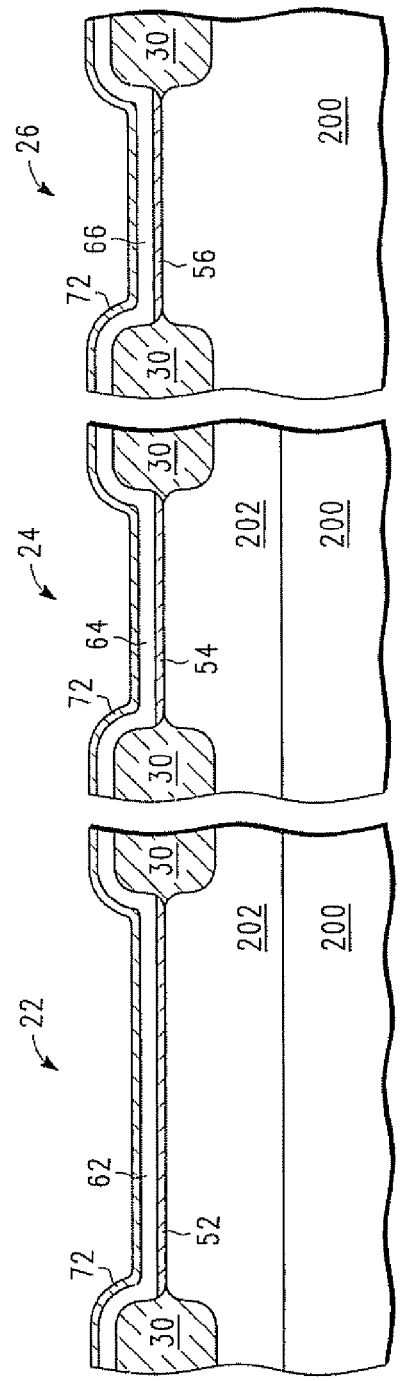
FIG. 7 includes an illustration of a cross-sectional view of the workpiece of FIG. 6 after forming a capping layer.

FIG. 7 includes an illustration of a cross-sectional view after forming a capping layer 72 that can include an antireflective film, a protective film, another suitable film, or any combination thereof. The capping layer 72 can include a dielectric material, such as an oxide, a nitride, or any combination thereof. The capping layer 72 has a thickness sufficient to substantially prevent a silicide reaction between a material within an underlying electrode layer and a subsequently-deposited metal layer. In a particular embodiment, the capping layer 72 has a thickness in a range of approximately 10 nm to approximately 90 nm. In another embodiment, the thickness of the capping layer 72 can be thinner or thicker to meet the needs or desires for a particular application. The capping layer 72 can be formed using a conventional or proprietary deposition technique.

Figure 8:
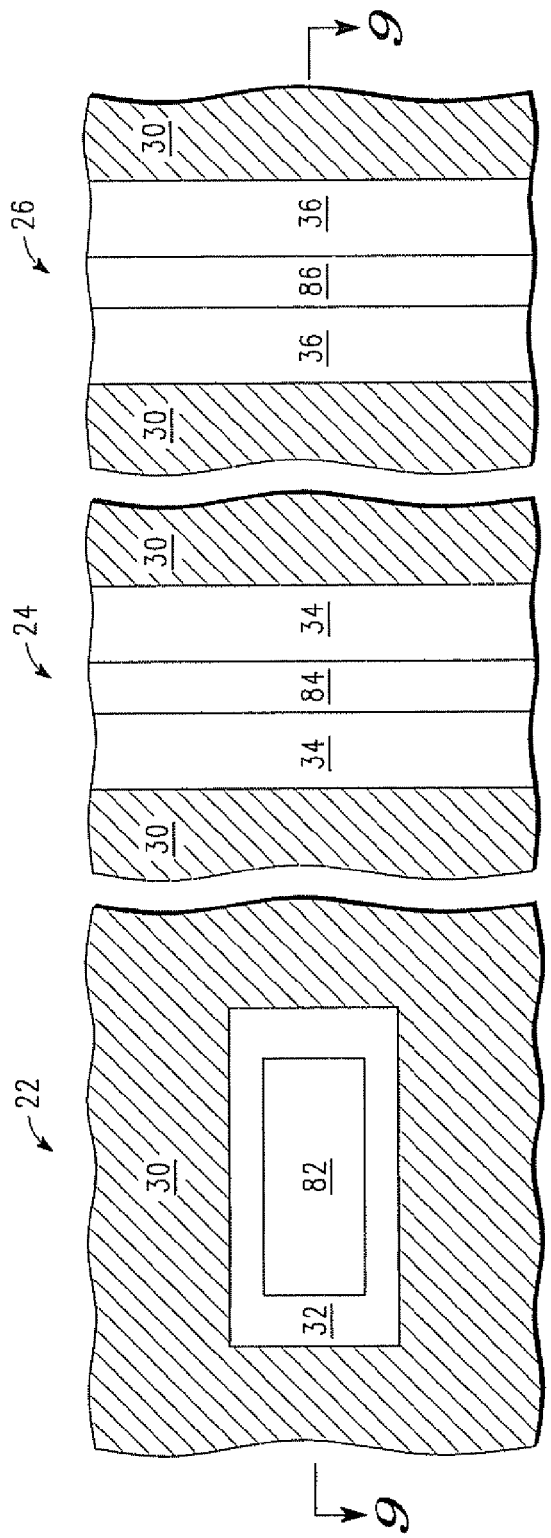
FIG. 8 includes an illustration of a top view of the workpiece of FIG. 7 after forming a capacitor electrode and patterned members.

FIG. 8 includes an illustration of a top view of the workpiece after forming a capacitor electrode 82 within the capacitor region 22, a patterned member 84 within the p-channel transistor region 24, and a patterned member 86 within the n-channel transistor region 26. The capping layer 72 is not illustrated in FIG. 8 to illustrate better the relationships between the capacitor electrode 82, the patterned member 84, and the patterned member 86 to the field isolation region 30, the active region 32, the active region 34, and the active region 36. The patterning can be performed using a conventional or proprietary patterning operation.

Figure 9:
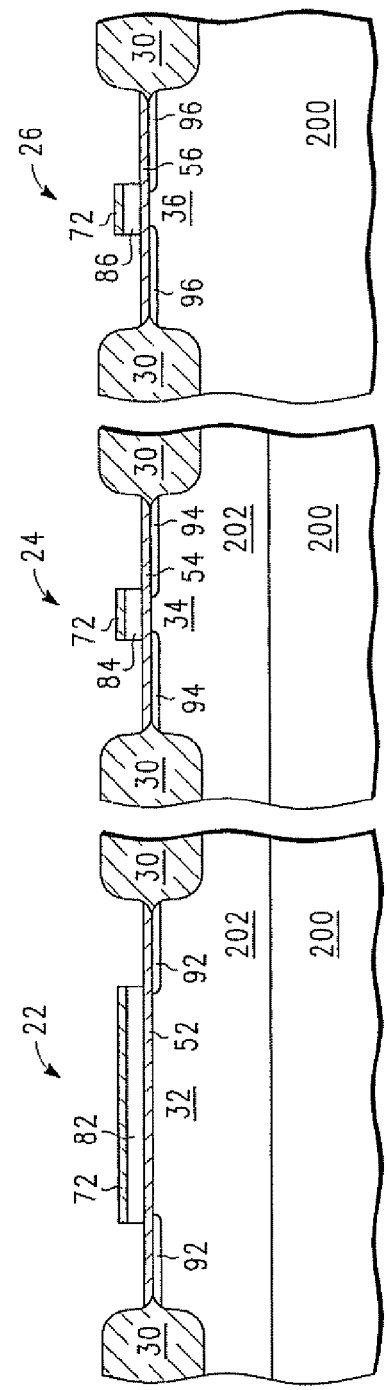
FIG. 9 includes an illustration of a cross-sectional view of the workpiece of FIG. 8 after forming lightly-doped drain or extension regions.

FIG. 9 includes an illustration of a cross-sectional view of the workpiece after forming doped regions 92, 94 and 96 within the active regions 32, 34, and 36, respectively. The view in FIG. 9 is along the sectioning line 9-9 in FIG. 8 after forming the doped regions 92, 94, and 96. The doped regions 94 and 96 can be used as lightly-doped drain or extension regions. The doped regions 92 and 96 can be n-type doped, and the doped regions 94 can be p-type doped. The doping concentration can be in a range of approximately 1E16 to 1E19 atoms/$cm^3$. One or more masking sequences can be performed in conjunction with a doping operation, so that the needed or desired doping concentration is achieved. The masking sequence(s) and doping operations can be performed using conventional or proprietary techniques. In an alternative embodiment, the doped regions 92 are not required.

Figure 10:
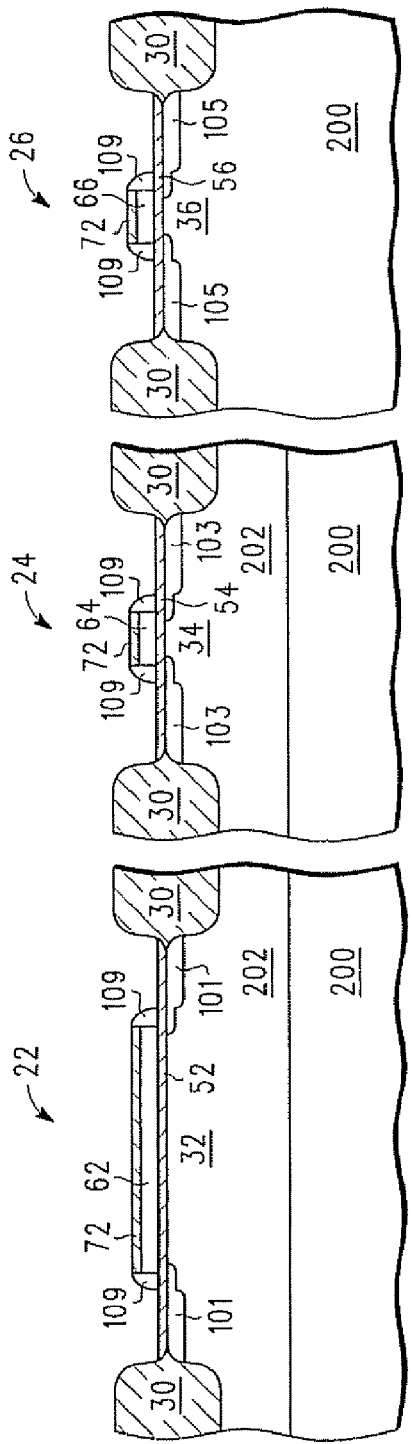
FIG. 10 includes an illustration of a cross-sectional view of the workpiece of FIG. 9 after forming sidewall spacers, well ties, and source/drain regions.

FIG. 10 includes an illustration of a cross-sectional view of the workpiece after forming sidewall spacers 109, well ties 101, and source/drain regions 103 and 105. A thin thermal oxide layer (not illustrated) may be formed before conformally depositing and anisotropically etching a nitride layer to form the sidewall spacers 109. In another embodiment, a different technique can be used to form the sidewall spacers 109, and achieve a different profile (e.g., squared or triangular, rather than parabolic) for the sidewall spacers 109.

The well ties 101 and the source drain regions 103 and 105 can be formed after forming the sidewall spacers 109. The well ties 101 and source/drain regions 105 can be n-type doped, and the source/drain regions 103 can be p-type doped. The doping concentration can be at least approximately 1E19 atoms/$cm^3$ to allow ohmic contacts to be subsequently formed to the well ties 101 and source/drain regions 103 and 105. One or more masking sequences can be performed in conjunction with a doping operation, so that the needed or desired doping concentration is achieved.

Figure 11:
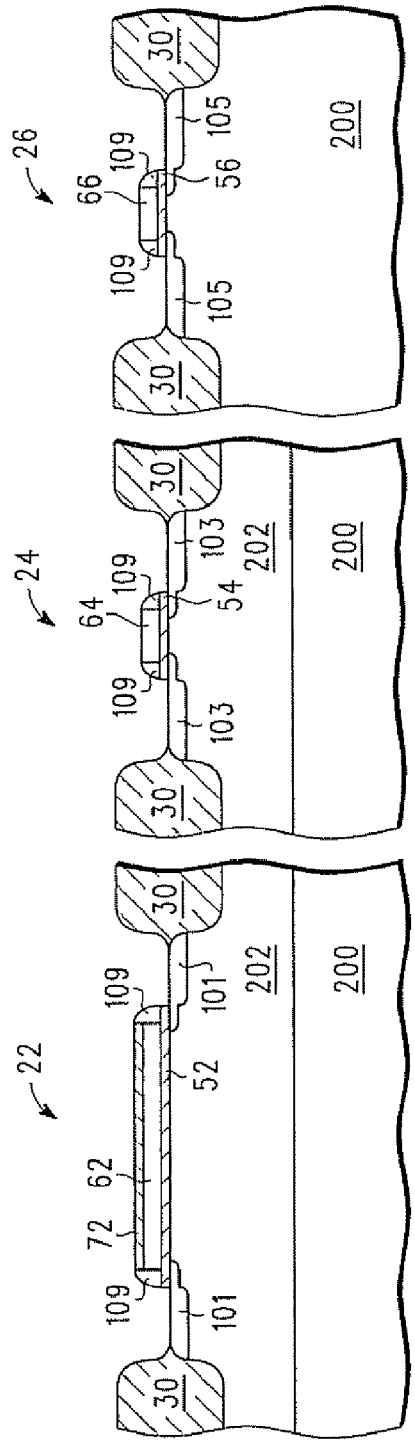
FIG. 11 includes an illustration of a cross-sectional view of the workpiece of FIG. 10 after removing portions of the capping layer from over patterned members.

FIG. 11 includes an illustration of a cross-sectional view of the workpiece after removing a portion of the capping layer 72 after exposing portions of the patterned members 64 and 66, the well ties 101, and the source/drain regions 103 and 105. A remaining portion of the capping layer 72 can be used as a silicide block to substantially prevent a silicide from being formed from an underlying feature. A mask (not illustrated) can be formed over the region 22 using a conventional or proprietary technique. The mask can define an opening that exposes the workpiece, and particularly, the capping layer 72 within the region 24 and the region 26. Other portions of the workpiece that are not illustrated may be covered by the mask (e.g., resistors) or may be exposed (e.g., buried contacts, local interconnects, etc.). After selectively removing portions of the capping layer 72 using a conventional or proprietary etching technique, the mask is removed. At this point in the process, the capacitor electrode 62 is covered by the capping layer 72, and the patterned members 64 and 66 have exposed surfaces. One or more dielectric layers are removed from over the well ties 101 and the source/drain regions 103 and 105 using a conventional or proprietary etching technique.

Figure 12:
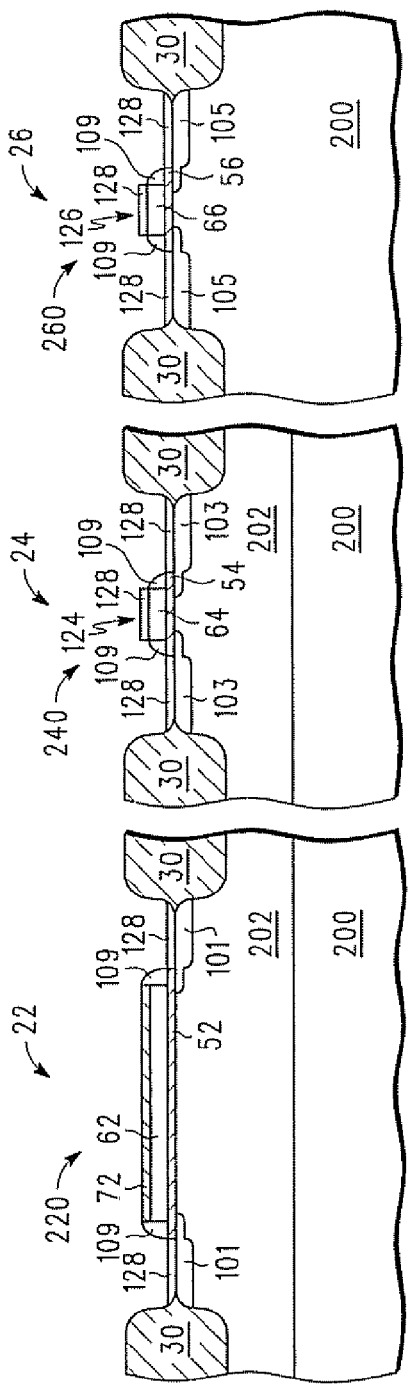
FIG. 12 includes an illustration of a cross-sectional view of the workpiece of FIG. 11 after forming silicide regions.

FIG. 12 includes an illustration of a cross-sectional view of the workpiece after forming silicide regions 128. A metal-containing layer can be formed over the workpiece. The metal-containing layer can include titanium, tantalum, cobalt, platinum, nickel, or the like. The workpiece with the metal-containing layer can be taken to a temperature sufficient to react with exposed portions of the workpiece that principally include Group 14 atoms (e.g. silicon or germanium). The exposed portions include part of the well ties 101, the source/drain regions 103 and 105, and the patterned members 64 and 66. Such exposed portions react with the metal-containing layer to form the silicide regions 128. The metal-containing layer does react to form a significant amount silicide along surfaces of dielectric materials, such as the field isolation region 30, the capping layer 72, and the sidewall spacers 109. Unreacted portions of the metal-containing layer are removed. The process sequence, including forming the metal-containing layer, reacting the metal-containing layer to form the silicide regions 128, and removal of unreacted portions of the metal-containing layer, can be conventional or proprietary and tailored to meets the needs or desires for a particular application.

At this point in the process, electronic components have been formed. A low-pass filter 220 in FIG. 12, structurally similar to the low-pass filter 10 in FIG. 1, lies within the region 22. Referring to FIG. 12, a portion of the well region 202 lying between the well ties 101 and under the capacitor electrode 62 acts as a resistive electrode, similar to the well region 102 in FIG. 1. In FIG. 12, the capacitor dielectric layer 52 can be the capacitor dielectric for the low-pass filter 220. The capacitor electrode 62 can perform a similar function as the resistive electrode 108 in FIG. 1. The low-pass filter will subsequently have input and output terminals coupled to different parts of the capacitor electrode 62.

A p-channel transistor structure 240 lies within the region 24. The p-channel transistor structure 240 includes source/drain regions 103 and a channel region that includes the portion of the well region 202 lying between the source/drain regions 103. The p-channel transistor structure 240 further includes the gate dielectric layer 54 and a gate electrode 124. The gate electrode 124 includes the patterned member 64 and the silicide region 128 that overlies the patterned member 64. An n-channel transistor structure 260 lies within the region 26. The n-channel transistor structure 260 includes source/drain regions 105 and a channel region that includes the portion of the substrate 200 lying between the source/drain regions 105. The n-channel transistor structure 260 further includes the gate dielectric layer 56 and a gate electrode 126. The gate electrode 126 includes the patterned member 66 and the silicide region 128 that overlies the patterned member 66. Each of the p-channel transistor structure 240 and the n-channel transistor structure 260 can be configured such that it performs as a transistor or a capacitive element (e.g., source/drain regions 103 may be subsequently connected to each other, or the source/drain regions 105 may be subsequently connected to each other).

Figure 13:
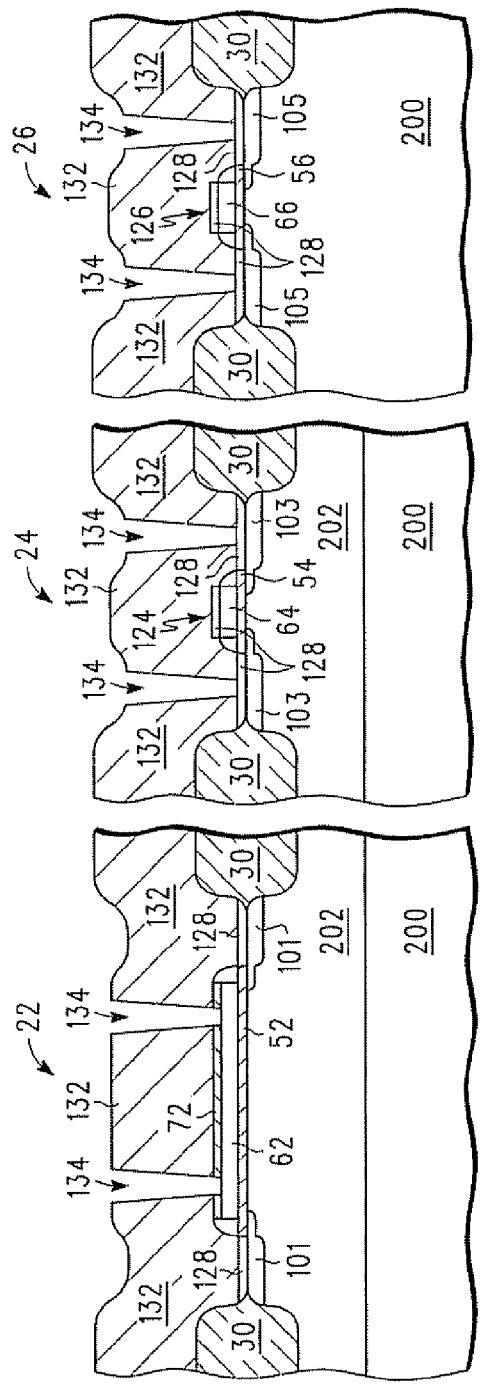
FIG. 13 includes an illustration of a cross-sectional view of the workpiece of FIG. 12 after forming an interlevel dielectric and contact openings.

FIG. 13 includes an illustration of a cross-sectional view of the workpiece after forming an interlevel dielectric layer 132 and contact openings 134. The interlevel dielectric layer 132 can include one or more films of oxide, nitride, oxynitride or any combination thereof. The thickness of the interlevel dielectric layer 132 can be in a range of approximately 50 to approximately 900 nm. In another embodiment, the interlevel dielectric layer 132 can be thinner or thicker depending on the needs or desires for a particular application. A mask (not illustrated) can be formed over the interlevel dielectric layer 132 and define openings within the mask where the contact openings 134 are to be located. An etch sequence is performed to pattern the interlevel dielectric layer 132, and in some locations the capping layer 72, and define the contact openings 134. Although not illustrated, other contact openings are formed to the well ties 101, the gate electrode 124 and the gate electrode 126. The mask is then removed. The formation of the interlevel dielectric layer 132, the contact openings 134, and the masking sequence can be performed using conventional or proprietary techniques.

Figure 14:
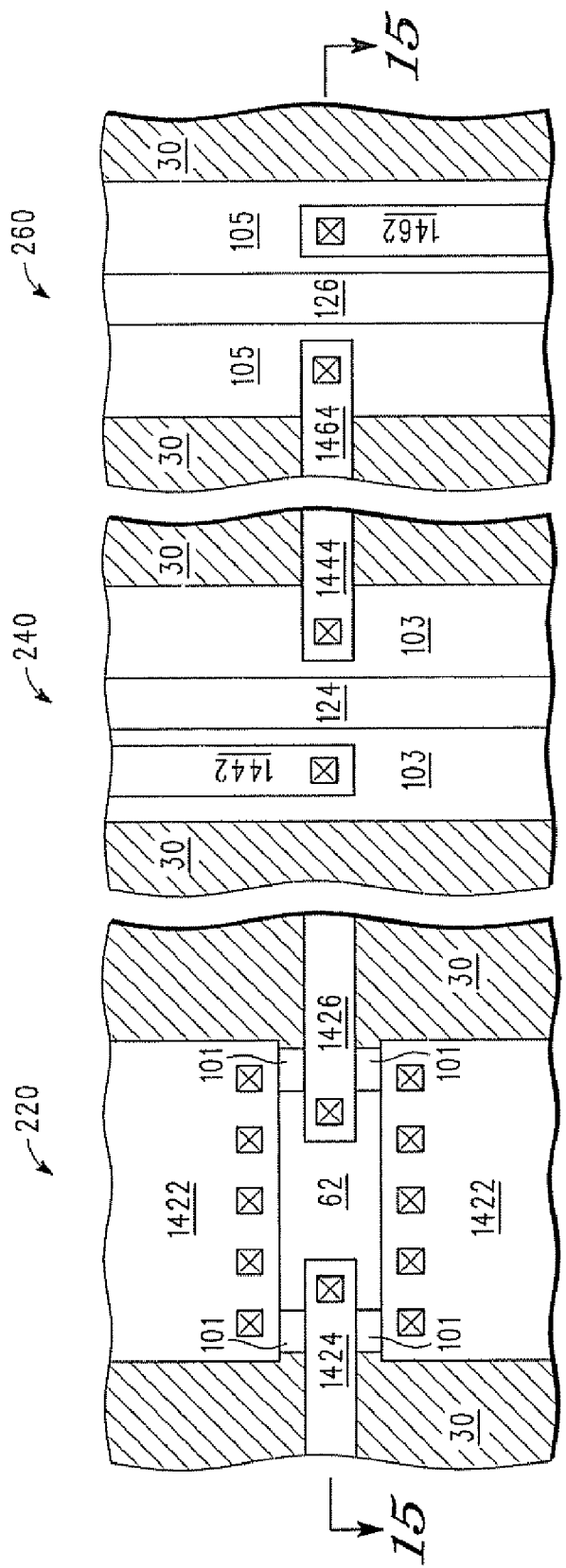
FIGS. 14 and 15 include illustrations of a top view and a cross-sectional view, respectively, of the workpiece of FIG. 13 after forming interconnects.
Figure 15:
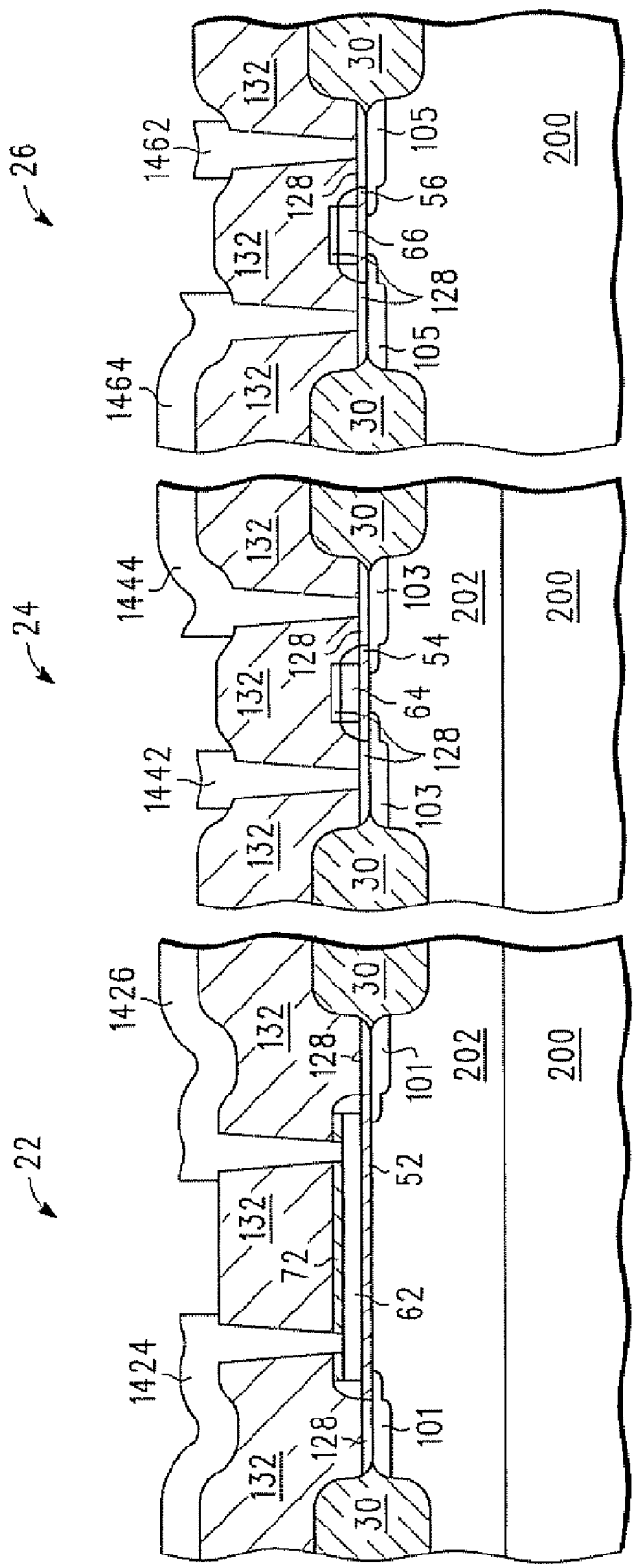

FIGS. 14 and 15 include illustrations of a top view and a cross-sectional view, respectively, after forming a level of interconnects. In FIG. 14, the silicide regions 128 are not illustrated over the well ties 101 and the source/drain regions 103 and 105 to illustrate better positional relationships between the features. The "⊠" symbol is used to denote where a contact is made between an interconnect and an underlying feature. The number of contacts can be more or fewer than is illustrated in FIG. 14. Interconnects 1424 and 1426 can be part of the input and output terminals, respectively for the low-pass filter 220. Interconnects 1422 can be coupled to the well ties. The interconnects 1422, 1424, and 1426 can correspond to the terminals 119, 115, and 117 in FIG. 1.

The interconnects 1442 and 1444 can be coupled to the source/drain regions 103 of the p-channel transistor structure 240, and the interconnects 1462 and 1464 can be coupled to the source/drain regions 105 of the n-channel transistor structure 260. When the p-channel transistor structure 240 and the n-channel transistor structure 260 are part of an inverter, the interconnects 1444 and 1464 can be electrically coupled together or may be different parts of the same interconnect and be an output from the inverter. The interconnect 1442 can be coupled to a $V_{DD}$ terminal, and the interconnect 1462 can be coupled to a $V_{SS}$ terminal. Interconnects can be made to the gate electrodes 124 and 126 but are not illustrated in FIGS. 14 and 15. Continuing with the inverter embodiment, the gate electrodes 124 and 126 can be coupled together and form an input terminal for the inverter. Although not illustrated, well region 202 contains well ties which can be coupled to a $V_{DD}$ terminal.

Figure 16:
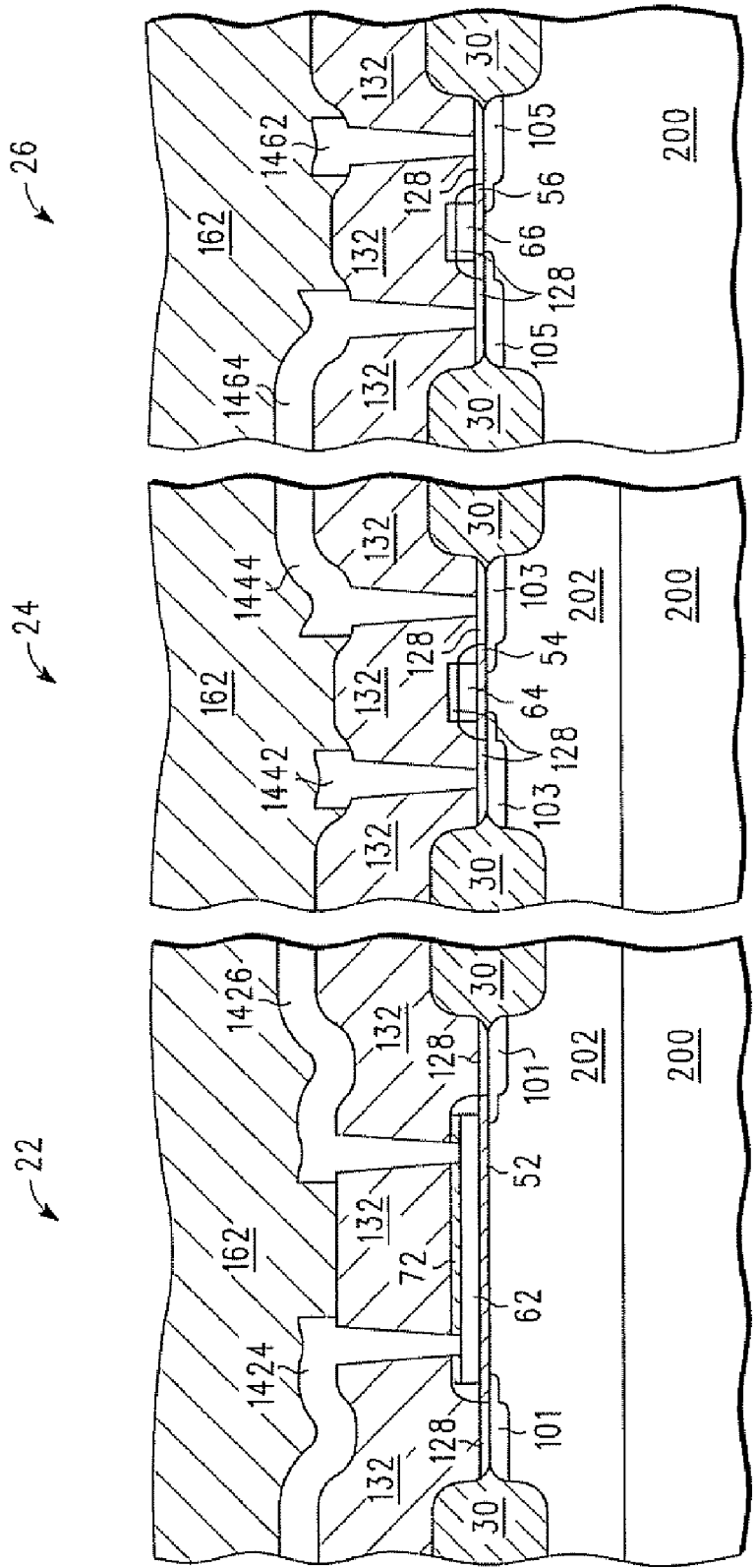
FIG. 16 includes an illustration of a cross-sectional view of the workpiece of FIGS. 14 and 15 after forming a substantially completed electronic device.

FIG. 16 includes an illustration of a cross-sectional view of a substantially completed electronic device. One or more additional interlevel dielectric layers and interconnect levels (not illustrated) can be formed if needed or desired. After the last interconnect level has been formed, a passivation layer 162 is formed. The passivation layer 162 can include one or more insulating film, such as an oxide, a nitride, an oxynitride, or a combination thereof. Bond pad openings can be formed through the passivation layer 162 and expose underlying bond pads.

Embodiments as described with respect to FIGS. 2 to 16 are useful in integrating a low-pass filter into a complementary metal-oxide-semiconductor ("CMOS"), single silicon (e.g., polysilicon) process flow. In a particular embodiment, the low-pass filter 220 can be similar to a process used to form the n-channel transistor structure 260 except that the low-pass filter 220 is formed within the well region 202 that can be an n-well region. Thus, the well region 202 can be used with the low-pass filter 220 and the n-channel transistor 260. The capacitor dielectric layer 52 can be formed at substantially the same time and with substantially of the same material as the gate dielectric layer 56, and potentially the gate dielectric layer 54. Similarly, the capacitor electrode 62 can be formed at substantially the same time and with substantially of the same material as the patterned member 66, and potentially the patterned member 64. The well ties 101 can be formed at substantially the same time and with substantially of the same dopant and concentration as the source/drain region 105. Therefore, some of the embodiments described herein can be formed without having to add any new operations to an existing CMOS process flow.

Other embodiments (not illustrated) can be used to form the electronic device having the low-pass filter and still use a CMOS-type process flow. In a particular embodiment, the input and output terminals for the low-pass filter can be made to a base region (e.g., a well region) and the capacitor electrode 82 that overlies the capacitor dielectric layer 52 may be maintained at a substantially constant voltage during normal operation. After reading this specification, skilled artisans will appreciate that material selection, thickness, doping concentration, layout dimensions, or any combination thereof can affect the resistance within the capacitor electrode 82, the base region, or both. In another particular embodiment, the conductivity types within the low-pass filter can be reversed. In this embodiment, the low-pass filter would be formed in a manner similar to the p-channel transistor 240 except that it would have a resistive electrode within a p-type substrate or within a p-well region. In yet another particular embodiment, the low-pass filter would have a structure similar to an n-channel transistor structure, such as n-channel transistor structure 260. In this particular embodiment, the low-pass filter would partly lie within a p-type substrate or p-well region and the well ties 101 would be replaced by N+ doped regions. In still another particular embodiment, the dopant types can be reversed (the well ties 101 would be replaced by P+ doped regions within an n-type substrate or an n-well region).

The concepts described herein can be extended to other embodiments. FIGS. 17 to 21 illustrate a differential resistor-capacitor circuit, e.g., a differential low-pass filter. The figures illustrate the differential resistor-capacitor circuit at fewer points in the process sequence as compared with the embodiments of FIGS. 2 to 16; however, after reading this specification, skilled artisans will appreciate that n-channel and p-channel transistor structures can be also be formed but are not illustrated in FIGS. 17 to 21. Thus, the differential resistor-capacitor circuit can also be formed using a CMOS process sequence without having to add any specific steps just for the differential resistor-capacitor circuit.

Figure 17:
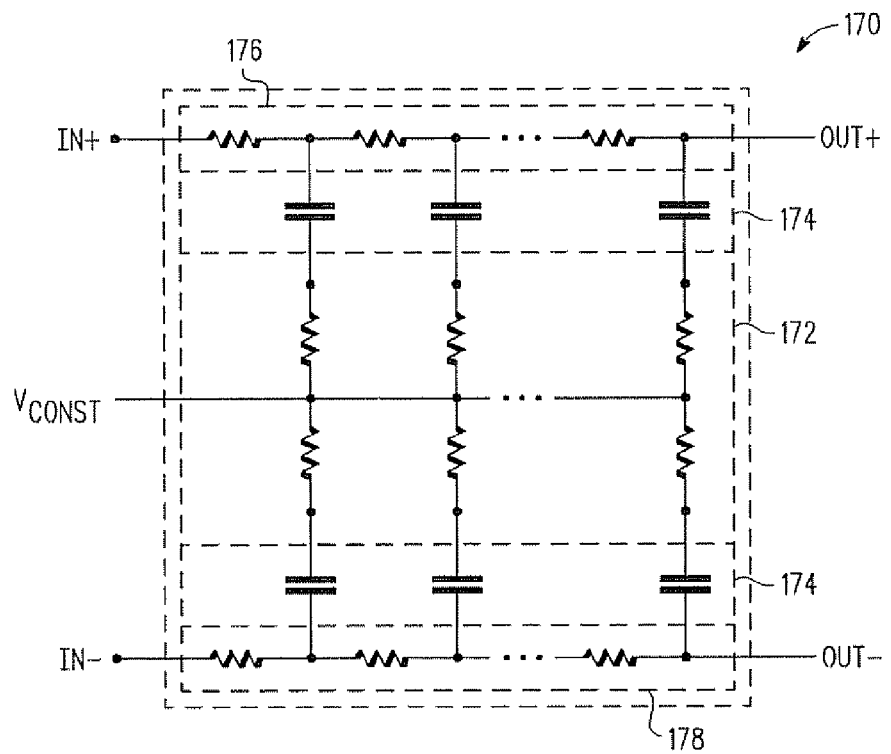
FIG. 17 includes a circuit diagram of a differential filter.

FIG. 17 includes a circuit diagram of a differential low-pass filter 170. The differential low-pass filter can include a base region 172, such as portion of a base layer or a well region, which can be modeled as a plurality of resistors. The base region 172 can be coupled to a terminal that normally operates at a substantially constant voltage, such as a reference voltage. A capacitor dielectric layer 174 can be modeled as a plurality of capacitors. Resistive capacitor electrodes 176 and 178 can be modeled as pluralities of resistors. Each of the resistive capacitor electrodes 176 and 178 can be coupled to different input and output terminals, such as IN+, IN−, OUT+, and OUT− in FIG. 17. The differential low-pass filter can be formed using a process flow such as the embodiments described with respect to FIGS. 2 to 16. FIGS. 18 to 21 include illustrations of an electronic device having a differential low pass filter, such as the differential low-pass filter. Structural elements illustrated in FIGS. 18 to 21 will be correlated to some of the features in FIG. 17.

Figure 18:
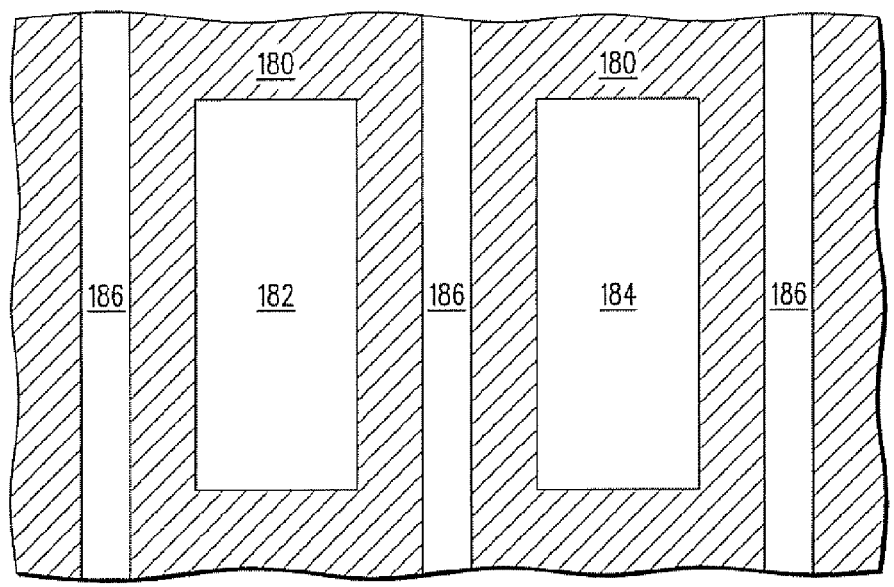
FIG. 18 includes an illustration of a top view of a portion of a workpiece after forming a field isolation region.

FIG. 18 includes an illustration of a top view of a portion of a workpiece after forming a field isolation region 180 that defines active regions 182, 184, and 186. The active regions 182, 184, and 186 can have the same conductivity type and substantially the same dopant concentration, or the active regions 182, 184, and 186 can have different conductivity types, different dopant concentrations, or a combination thereof. In a particular embodiment, the active regions 182, 184, and 186 are different parts of an n-well region that lie between the field isolation region 180. The active regions 182 and 184 can be used as resistive electrodes for the differential resistor-capacitor circuit, and the active regions 186 can be used for making subsequent well ties.

Figure 19:
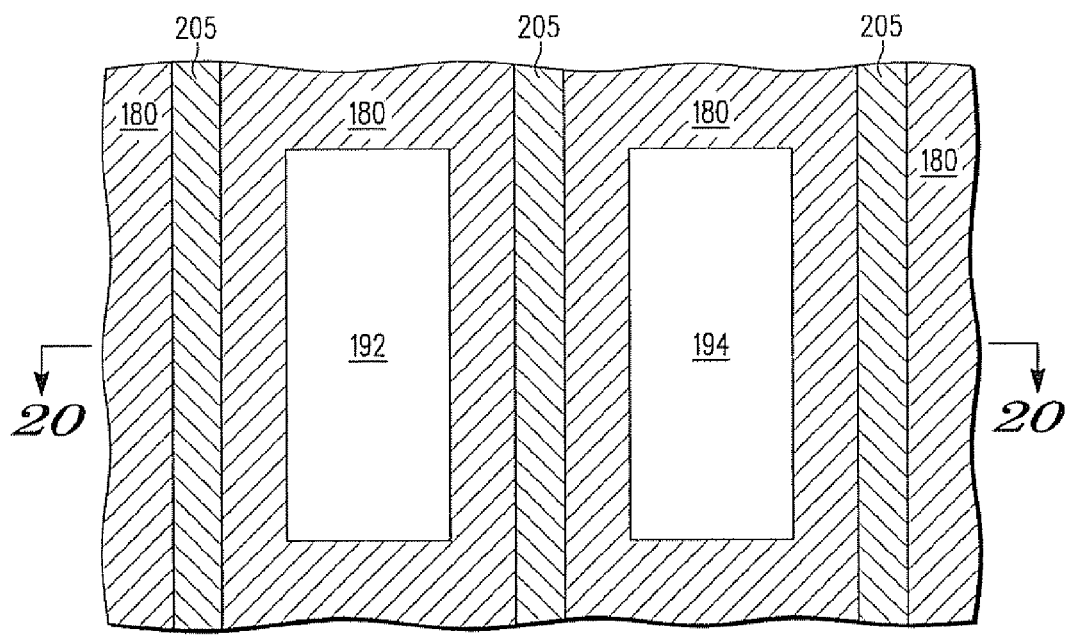
FIGS. 19 and 20 include illustrations of a top view and a cross-sectional view, respectively, of the workpiece of FIG. 18 after forming electrodes.
Figure 20:
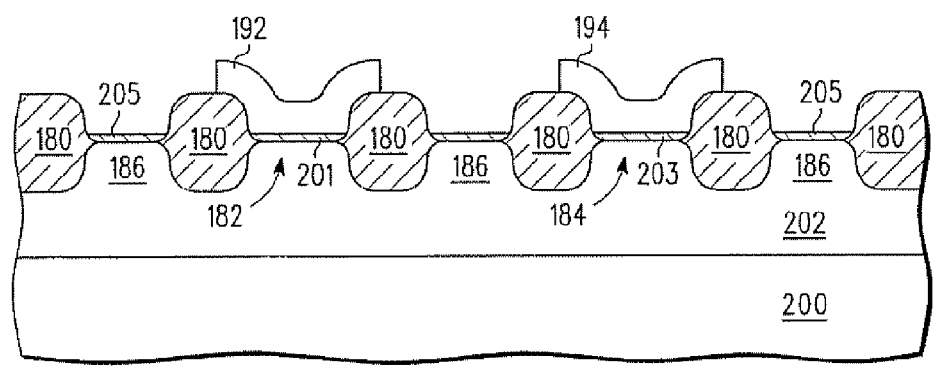

FIGS. 19 and 20 include illustrations of the workpiece after forming dielectric layers 201, 203, and 205 and capacitor electrodes 192 and 194. The dielectric layer 201, 203, and 205 can be formed using any of the embodiments as described with respect to the capacitor dielectric layer 52. The dielectric layers 201 and 203 are the capacitor dielectrics for the differential filter and correspond to the capacitor dielectric layer 174 in FIG. 17. Any combination of the dielectric layers 201, 203, and 205 may have the same composition or different compositions, the same thickness or different thicknesses, and be formed at substantially the same time or at different times. In a particular embodiment, the dielectric layers 201, 203, and 205 have substantially the same composition, substantially the same thickness, and are formed at the same time.

The capacitor electrodes 192 and 194 can be formed using any of the embodiments as previously described with respect to the capacitor electrode 62. The capacitor electrodes 192 and 194 are resistive electrodes for the differential low-pass filter and correspond to the resistive electrodes 176 and 178 in FIG. 17. The capacitor electrodes 192 and 194 may have the same composition or different compositions, the same thickness or different thicknesses, and be formed at substantially the same time or at different times. As illustrated in FIGS. 19 and 20, the capacitor electrodes 192 and 194 can be formed such they completely cover the underlying active regions 182 and 184, and all lateral sides (i.e., all but the surfaces closest to and furthest from the active regions 182 and 184) of the capacitor electrodes 192 and 194 extend onto the field isolation region 180. In another embodiment (not illustrated), fewer sides (e.g., 3 sides, 2 sides, 1 side) of the capacitor electrode 192, 194, or both may extend onto the field isolation region 180, or no sides of the capacitor electrode 192, 194, or both extend onto the field isolation region 180 (similar to the capacitor electrode 62).

Figure 21:
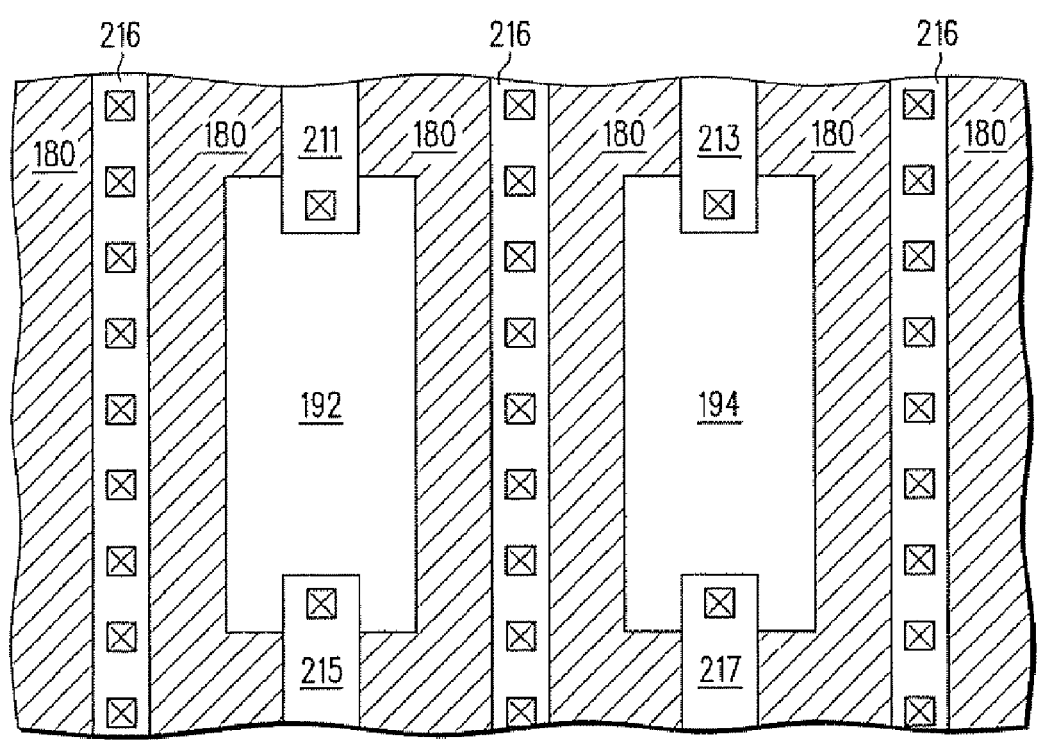
FIG. 21 includes an illustration of a top view of the workpiece of FIGS. 18 and 19 after forming interconnects.

FIG. 21 includes an illustration of a top view of the workpiece of FIGS. 19 and 20 after forming interconnects. Interconnects 216 are coupled to underlying well ties (not illustrated) that are formed within the active regions 186. The interconnects can be coupled to a terminal that provides a substantially constant or a reference voltage. Interconnects 211 and 213 are coupled to the capacitive electrodes 192 and 194, respectively, and can be input terminals for the differential resistor-capacitor circuit, and interconnects 215 and 217 are also coupled to the capacitive electrodes 192 and 194, respectively, and can be output terminals for the differential low-pass filter. The outputs to the differential low-pass filter can be coupled to another circuit or component. An example of such circuit or component can include a sampled-data analog circuit, a comparator, or the like. Additional process may be performed similar to that described with respect to FIG. 16 to form a substantially completed electronic device.

In another embodiment (not illustrated), no field isolation may lie between the well ties and the capacitor electrodes 192 and 194. In still another embodiment (not illustrated) separate well ties may be used between the capacitor electrodes 192 and 194, rather than having a shared well tie.

Embodiments as described herein are useful in integrating a low-pass filter into a complementary metal-oxide-semiconductor ("CMOS"), single silicon (e.g., polysilicon) process flow. In a particular embodiment, the low-pass filter 220 can be similar to a process used to form the n-channel transistor structure 260 except that the low-pass filter 220 is formed within the well region 202 that can be an n-well region. Thus, the well region 202 can be used with the low-pass filter 220. The capacitor dielectric layer 52 can be formed at substantially the same time and with substantially of the same material as the gate dielectric layer 56, and potentially the gate dielectric layer 54. Similarly, the capacitor electrode 62 can be formed at substantially the same time and with substantially of the same material as the patterned member 66, and potentially the patterned member 64. The well ties 101 can be formed at substantially the same time and with substantially of the same dopant and concentration as the source/drain region 105. Therefore, some of the embodiments described herein can be formed without having to add any new operations to an existing CMOS process flow. The processing simplicity also applies to the differential filter as described with respect to FIGS. 17 to 21.

Other embodiments (not illustrated) can be used to form the electronic device having the low-pass filter and still use a CMOS-type process flow. In a particular embodiment, conductivity types within the low-pass filter can be reversed. In this embodiment, the low-pass filter would be formed in a manner similar to the p-channel transistor 240 except that it would have a resistive electrode within a p-type substrate or within a p-well region. In another particular embodiment, the low-pass filter would have a structure similar to an n-channel transistor structure, such as n-channel transistor structure 260. In this particular embodiment, the low-pass filter would partly lie within a p-type substrate or p-well region and the well ties 101 would be replaced by $N^+$ doped regions. In still another particular embodiment, the dopant types can be reversed (the well ties 101 would be replaced by $P^+$ doped regions within an n-type substrate or an n-well region). These alternatives can also be used for the differential filter as illustrated in FIGS. 17 to 21.

Thus, the concepts can be used to implement a relatively low-cost, area-effective, simple, CMOS-compatible, anti-aliasing low-pass filter for analog circuits with sampled input signals, such as switched capacitor and analog-to-digital converters. The anti-aliasing low-pass filter can be used with a switched-capacitor, programmable-gain amplifier used in pulse width modulation motor control applications.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a capacitor dielectric layer over a base region, wherein the base region includes a base semiconductor material. The process can also include forming a gate dielectric layer over a substrate, and forming a capacitor electrode over the capacitor dielectric layer. The process can further include forming a gate electrode over the gate dielectric layer. The process can still further include forming an input terminal and an output terminal to the capacitor electrode. The input terminal and the output terminal can be spaced apart from each other and are connected to different components within the electronic device. A filter includes the base region, the capacitor dielectric layer, and the capacitor electrode. A transistor structure can include the gate dielectric layer and the gate electrode.

In an embodiment of the first aspect, the process further includes forming a terminal to the base region, wherein the terminal is operable to be biased to a substantially constant voltage. In a particular embodiment, the process further includes forming a well region within a substrate, wherein the base region includes the well region. In another particular embodiment, forming the capacitor electrode and forming the gate electrode include forming a first layer over the capacitor dielectric layer and the gate dielectric layer, wherein the first layer includes a doped semiconductor material, forming an insulating layer over the first layer, patterning the first layer and the insulating layer to form a first remaining portion over the capacitor dielectric layer. Forming the capacitor electrode and forming the gate electrode can also include removing the insulating layer from over the second remaining portion of the first layer, and forming a silicide region over the second remaining portion of the first layer. The gate electrode includes the silicide region and the second remaining portion of the first layer, the capacitor electrode includes the first remaining portion of the first layer; and during forming the silicide region, the first remaining portion of the insulating layer overlies the first remaining portion of the first layer.

In another embodiment of the first aspect, forming the capacitor electrode includes depositing a layer of semiconductor material and annealing the layer to affect grains within the layer. In a particular embodiment, the layer includes a substantially undoped semiconductor material. In still another embodiment, forming the gate electrode and forming the capacitor electrode includes depositing a layer of semiconductor material, doping substantially all of the layer, selectively doping a portion of the layer, and patterning the layer to form the gate electrode and the capacitor electrode. The gate electrode includes a dopant from doping substantially all of the layer and selectively doping the portion of the layer, and the capacitor electrode includes a dopant from doping substantially all of the layer but not selectively doping the portion of the layer.

In a further embodiment of the first aspect, forming the capacitor dielectric layer and forming the gate dielectric layer are performed substantially simultaneously during a point in time, include substantially a same composition, and have substantially a same thickness.

In a second aspect, a process of forming an electronic device can include forming a first capacitor dielectric layer over a base region, forming a second capacitor dielectric layer over the base region, forming a first capacitor electrode over the first capacitor dielectric layer, and forming a second capacitor electrode over the second capacitor dielectric layer. The process can also include forming a first input terminal and a first output terminal to the first capacitor electrode, and forming a second input terminal and a second output terminal to the second capacitor electrode, wherein a differential resistor-capacitor circuit includes the base region, the first capacitor dielectric layer, the first capacitor electrode, the second capacitor dielectric layer, and the second capacitor electrode.

In an embodiment of the second aspect, the process further includes forming a first gate dielectric layer over a substrate, forming a second gate dielectric layer over the substrate, forming a first gate electrode over the first gate dielectric layer, forming a second gate electrode over the second gate dielectric layer, forming first source/drain regions adjacent to the first gate electrode, and forming second source/drain regions adjacent to the second gate electrode. The process can be performed such that a p-channel transistor structure includes the first gate dielectric layer, the first gate electrode, and the first source/drain regions, and an n-channel transistor structure includes the second gate dielectric layer, the second gate electrode, and the second source/drain regions.

In a particular embodiment of the second aspect, forming the first capacitor dielectric layer, the second capacitor dielectric layer, the first gate dielectric layer, and the second gate dielectric layer are performed substantially simultaneously during a point in time, include substantially a same composition, and have substantially a same thickness. In another particular embodiment, forming the first capacitor electrode, the second capacitor electrode, the first gate electrode, and the second gate electrode includes depositing a first layer over the first capacitor dielectric layer, second capacitor dielectric layer, the first gate dielectric layer, and the second gate dielectric layer, and patterning the first layer to produce shapes corresponding to the first capacitor electrode, the second capacitor electrode, the first gate electrode, and the second gate electrode. In a more particular embodiment, forming the first input terminal and the first output terminal and forming the second input terminal and the second output terminal are performed substantially simultaneously during a point in time. In an even more particular embodiment, each of the first capacitor electrode and the second capacitor electrode has a same dopant type and substantially the same dopant concentration as the first gate electrode or the second gate electrode.

In still another particular embodiment of the second aspect, the process further includes forming a doped region within the base region, wherein forming the first source/drain regions or forming the second source/drain regions is performed substantially simultaneously during a point in time forming the doped region within the base region. In a further embodiment, the process further includes forming a field isolation region to define a first active region and a second active region, wherein forming the first capacitor electrode is performed such that substantially all of the first capacitor electrode overlies the first active region, and forming the second capacitor electrode is performed such that substantially all of the second capacitor electrode overlies the second active region.

In a third aspect, an electronic device can include a low-pass filter and a transistor structure. The low-pass filter can include a first capacitor electrode including a first input terminal and a first output terminal, a second capacitor electrode lying within a base region of a substrate, wherein terminals for the second capacitor electrode are at approximately a same voltage, and a first capacitor dielectric layer, wherein the first capacitor electrode and the second capacitor electrode lie along opposite sides of the capacitor dielectric layer. The transistor structure can include a gate dielectric layer over a substrate, wherein the gate dielectric layer and the first capacitor dielectric layer include substantially a same composition and substantially a same thickness, a gate electrode adjacent to the gate dielectric layer, and source/drain regions adjacent to the gate electrode.

In an embodiment of the third aspect, the low-pass filter further includes a second capacitor dielectric layer and a third capacitor electrode including a second input terminal and a second output terminal, the third capacitor electrode is spaced apart from the first capacitor electrode, the third capacitor electrode and the second capacitor electrode lie along opposite sides of the second capacitor dielectric layer, and the first input terminal and the second input terminal are coupled to different components. In another embodiment, the electronic device further includes a first active region, a second active region, and a field isolation region lying between the first active region and the second active region, wherein the first active region includes the second capacitor electrode, and the transistor structure includes the second active region.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

Many other embodiments may be apparent to those of skill in the art upon reviewing the disclosure. Other embodiments may be used or derived from the disclosure, such that a structural substitution, logical substitution, or another change may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming a capacitor dielectric layer over a base region, wherein the base region includes a base semiconductor material;
    forming a gate dielectric layer over a substrate,
    forming a capacitor electrode over the capacitor dielectric layer;
    forming a gate electrode over the gate dielectric layer;
    forming a field isolation region to define a first active area and a second active area, wherein from a top view the capacitor electrode covers at least three sides of the first active area and the gate electrode covers no more than two sides of the second active area; and
    forming an input terminal and an output terminal to the capacitor electrode or to the base region, wherein:

the input terminal and the output terminal are spaced apart from each other and are connected to different components within the electronic device;
a resistor-capacitor low-pass filter includes the base region, the capacitor dielectric layer, and the capacitor electrode; and
a transistor structure includes the gate dielectric layer and the gate electrode.

2. The process of claim 1, further comprising forming a terminal to the base region, wherein the terminal is operable to be biased to a substantially constant voltage.

3. The process of claim 2, further comprising forming a well region within a substrate, wherein the base region includes the well region.

4. The process of claim 2, wherein forming the capacitor electrode and forming the gate electrode comprise:
forming a first layer over the capacitor dielectric layer and the gate dielectric layer, wherein the first layer includes a doped semiconductor material;
forming an insulating layer over the first layer;
patterning the first layer and the insulating layer to form a first remaining portion over the capacitor dielectric layer and a second remaining portion over the gate dielectric layer;
removing the insulating layer from over the second remaining portion of the first layer; and
forming a silicide region over the second remaining portion of the first layer, wherein:
the gate electrode includes the silicide region and the second remaining portion of the first layer;
the capacitor electrode includes the first remaining portion of the first layer; and
during forming the silicide region, the first remaining portion of the insulating layer overlies the first remaining portion of the first layer.

5. The process of claim 1, wherein forming the capacitor electrode comprises:
depositing a layer of semiconductor material; and
annealing the layer to affect grains within the layer.

6. The process of claim 5, wherein the layer includes a substantially undoped semiconductor material.

7. A process of forming an electronic device comprising:
forming a capacitor dielectric layer over a base region, wherein the base region includes a base semiconductor material;
forming a gate dielectric layer over a substrate;
forming a capacitor electrode over the capacitor dielectric layer;
forming a gate electrode over the gate dielectric layer; and
forming an input terminal and an output terminal to the capacitor electrode or to the base region, wherein:
the input terminal and the output terminal are spaced apart from each other and are connected to different components within the electronic device;
a filter includes the base region, the capacitor dielectric layer, and the capacitor electrode; and
a transistor structure includes the gate dielectric layer and the gate electrode,
wherein forming the gate electrode and forming the capacitor electrode comprises:
depositing a layer of semiconductor material;
selectively doping a portion of the layer; and
patterning the layer to form the gate electrode and the capacitor electrode, wherein:
the gate electrode includes a dopant from doping substantially all of the layer and selectively doping the portion of the layer; and
the capacitor electrode does not include a dopant from selectively doping the portion of the layer.

8. The process of claim 1, wherein forming the capacitor dielectric layer and forming the gate dielectric layer are performed substantially simultaneously during a point in time, include substantially a same composition, and have substantially a same thickness.

9. A process of forming an electronic device comprising:
forming a first capacitor dielectric layer over a base region, wherein the base region includes a base semiconductor material;
forming a second capacitor dielectric layer over the base region;
forming a first gate dielectric layer over a substrate;
forming a first capacitor electrode over the first capacitor dielectric layer;
forming a second capacitor electrode over the second capacitor dielectric layer;
forming a first gate electrode over the first gate dielectric layer;
forming first source/drain regions adjacent to the first gate electrode;
forming a field isolation region to define a first active area and a second active area, wherein from a top view the first or second capacitor electrode covers at least three sides of the first active area, and the first gate electrode covers no more than two sides of the second active area;
forming a first input terminal and a first output terminal of a differential resistor-capacitor circuit to the first capacitor electrode, wherein the first input terminal and the first output terminal are spaced apart from each other and are connected to different components within the electronic device; and
forming a second input terminal and a second output terminal of the differential resistor-capacitor circuit to the second capacitor electrode,
wherein:
the differential resistor-capacitor low-pass circuit includes the base region, the first capacitor dielectric layer, the first capacitor electrode, the second capacitor dielectric layer, and the second capacitor electrode; and
a first transistor structure includes the first gate dielectric layer, the first gate electrode, and the first source/drain regions.

10. The process of claim 9, further comprising:
forming a second gate dielectric layer over the substrate;
forming a second gate electrode over the second gate dielectric layer;
forming second source/drain regions adjacent to the second gate electrode,
wherein:
a second transistor structure includes the second gate dielectric layer, the second gate electrode, and the second source/drain regions.

11. The process of claim 10, wherein forming the first capacitor dielectric layer, the second capacitor dielectric layer, the first gate dielectric layer, and the second gate dielectric layer are performed substantially simultaneously during a point in time, include substantially a same composition, and have substantially a same thickness.

12. The process of claim 11, wherein forming the first capacitor electrode, the second capacitor electrode, the first gate electrode, and the second gate electrode comprises:
depositing a first layer over the first capacitor dielectric layer, second capacitor dielectric layer, the first gate dielectric layer, and the second gate dielectric layer; and patterning the first layer to produce shapes corresponding to the first capacitor electrode, the second capacitor electrode, the first gate electrode, and the second gate electrode.

13. The process of claim 12, wherein forming the first input terminal and the first output terminal and forming the second input terminal and the second output terminal are performed substantially simultaneously during a point in time.

14. The process of claim 12 further comprising forming a doped region within the base region, wherein forming the first source/drain regions or forming the second source/drain regions is performed substantially simultaneously during a point in time as forming the doped region within the base region.

15. The process of claim 9, further comprising forming a field isolation region to define a first active region and a second active region, wherein:

forming the first capacitor electrode is performed such that substantially all of the first capacitor electrode overlies the first active region; and forming the second capacitor electrode is performed such that substantially all of the second capacitor electrode overlies the second active region.

16. The process of claim 9, further comprising forming a reference terminal that is electrically connected to the filter.

17. The process of claim 10, wherein the first transistor structure includes an n-channel transistor, and the second transistor structure includes a p-channel transistor.

18. The process of claim 1, further comprising forming a reference terminal that is electrically connected to the filter.

* * * * *